(12) United States Patent
Kim et al.

(10) Patent No.: US 6,414,501 B2
(45) Date of Patent: Jul. 2, 2002

(54) MICRO CANTILEVER STYLE CONTACT PIN STRUCTURE FOR WAFER PROBING

(75) Inventors: Dong Il Kim, Seoul; Young Kyum Ahn; Sam Won Chung, both of Kyunggi-do; Byung Chang Song; Ha Poong Jeong, both of Suwon, all of (KR)

(73) Assignee: AMST Co., Ltd., Kyunggi-do (KR)

( * ) Notice: Subject to any disclaimer, the term of this patent is extended or adjusted under 35 U.S.C. 154(b) by 0 days.

(21) Appl. No.: 09/965,607

(22) Filed: Sep. 27, 2001

Related U.S. Application Data

(63) Continuation-in-part of application No. 09/410,527, filed on Oct. 1, 1999, now abandoned.

(30) Foreign Application Priority Data

Oct. 1, 1998 (KR) ............................................. 98-41311

(51) Int. Cl.$^7$ ............................................... G01R 31/02
(52) U.S. Cl. ....................... 324/754; 324/752; 324/761; 324/762
(58) Field of Search ................................. 324/754, 762, 324/25.01, 752, 761, 757; 438/51, 52

(56) References Cited

U.S. PATENT DOCUMENTS

| | | | |
|---|---|---|---|
| 4,382,228 A | | 5/1983 | Evans |
| 4,480,223 A | * | 10/1984 | Aigo ........................... 324/752 |
| 4,585,991 A | * | 4/1986 | Reid et al. .................. 324/757 |
| 4,599,559 A | | 7/1986 | Evans |
| 4,719,417 A | | 1/1988 | Evans |
| 4,961,052 A | | 10/1990 | Tada et al. |
| 5,172,050 A | * | 12/1992 | Swapp ........................ 324/762 |
| 5,177,438 A | * | 1/1993 | Littlebury et al. ........... 324/754 |
| 5,177,439 A | * | 1/1993 | Liu et al. .................... 324/754 |
| 5,475,318 A | | 12/1995 | Marcus et al. |
| 5,521,518 A | | 5/1996 | Higgins |
| 5,723,347 A | | 3/1998 | Hirano et al. |
| 5,869,974 A | * | 2/1999 | Akram et al. ................ 324/754 |
| 5,900,738 A | * | 5/1999 | Khandros et al. ........... 324/761 |
| 5,903,161 A | | 5/1999 | Amemiya et al. |
| 5,923,952 A | | 7/1999 | Ismail et al. |
| 5,926,029 A | | 7/1999 | Ference et al. |
| 5,929,498 A | | 7/1999 | Ismail et al. |
| 5,959,957 A | | 9/1999 | Ikeda et al. |
| 5,965,943 A | | 10/1999 | Mizuta |
| 6,037,785 A | | 3/2000 | Higgins |
| 6,064,217 A | | 5/2000 | Smith |
| 6,072,190 A | | 6/2000 | Watanabe et al. |
| 6,146,917 A | | 11/2000 | Zhang et al. |
| 6,246,245 B1 | * | 6/2001 | Akram et al. ................ 324/754 |
| 6,279,227 B1 | * | 8/2001 | Khandros et al. ............. 29/885 |

OTHER PUBLICATIONS

Korean Utility Model Laid–Open Publication No. 93–9736 (with translation) May 26, 1993.
Korean Utility Model Laid–Open Publication No. 95–21440 (with translation), Jul. 28, 1995.

* cited by examiner

*Primary Examiner*—Safet Metjahic
*Assistant Examiner*—Wasseem H. Hamdan
(74) *Attorney, Agent, or Firm*—Schiff Hardin & Waite

(57) ABSTRACT

The present invention is to provide a micro cantilever-type probe disposed on a probe card, having such appropriate elasticity and mechanical strength that the probe would recover its unforced shape after deformation during an inspection and maintain its original shape even after three hundred thousand uses. The present invention provides a probe card which has an electrically insulated substrate fixed on a circuit board; a plurality of elastic probes with a sharpened end fixed on the insulated substrate; and wiring formed on the probe, the insulated substrate and the circuit board. The inventive probe is manufactured by patterning a substrate using photolithography and etching a portion except a pattern-defined portion. The probe is coated by metal layer(s).

20 Claims, 11 Drawing Sheets

MICRO CANTILEVER STYLE CONTACT PIN STRUCTURE FOR WAFER PROBING

RELATED APPLICATION

This application is a Continuation-In-Part of U.S. patent application Ser. No. 09/410,527, entitled "Vertical-Type Probe Card", filed on Oct. 1, 1999 which it was abandoned on Nov. 29, 2001.

FIELD OF THE INVENTION

The present invention relates generally to the testing of semiconductor devices and in particular to the fabrication of a micro-cantilever style contact pin structure as probe card for the test of microelectronic devices.

BACKGROUND OF THE INVENTION

When electronic devices such as semiconductor integrated circuits, LCD, PDP, FPD are produced they are inspected prior to being shipped out to verify their electrical characteristics as designed. A probe station, schematically shown in FIG. 5A, is commonly urged for such inspection. The probe station includes a probe card with a plurality of probes that couple test signal generation/detection circuitry of the probe station to one or plurality of pad(s) on a device undergoing inspection. The probe card is divided largely into two parts, i.e., a printed circuit board 12 and a plurality of probe needles 13 ("probes" hereafter). The circuit board 12 structurally supports the probes 13 and has wiring such that test signals from the signal generation/detection means can be communicated all the way to the pointed tips of the probes 13. The probes are made to contact respective pads on the device 6 during inspection, as shown in FIG. 5A.

The probe card is attached to the lower side of an insert ring which is connected to a head plate 10 in the periphery of the probe station. An electronic device 6 to be tested is placed on a stage 14, which is positioned below the probe card and is controlled to move horizontally and/or vertically in order to align with the probe card above. The probe station generates electric signals and transfers the signals to the probe card via so-called pogo pin 11 before applying them to electrical contact pads 5 (See FIG. 5B) of the device 6 via wiring formed on the probe card in order to see if the device works as designed. Signals from the device 6 are transferred to the probe station via the same path.

The conventional structure shown in FIGS. 5A and 5B is called as the horizontal type or the tungsten needle type. In this conventional structure, a tungsten needle 13 having the sharpened end portion is fixed to the station, and the sharpened end portion contacts the pad 5 of the device 6 to measure the electrical characteristics of the device. However, as the semiconductor device become smaller, the pads also becomes smaller, with side of several tens micrometers and with several tens of micrometers spacing. The width of the tungsten needle used in the conventional type is in the range of several hundreds micrometers, and therefore it is impossible to contact adjacent pads or to measure all circuit patterns which are needed to verify the circuit characteristics. Furthermore, it is difficult to assemble the probe needles accurately at desired positions since the tungsten needles are fixed on probe card manually under microscope.

To overcome the above-mentioned problems, micromachining has been adopted for the fabrication of the probe portion. Some representative of macromachined probes are disclosed in the U.S. Pat. Nos. 4,961,052, 5,172,050, 5,723, 347 and 5,869,974. Micromachining technology has been extensively developed for fabrication of mechanical structures sized less than millimeter down to few microns. Further, micromachining usually employs photolithographic process which ensures accurate positioning of the structure. Application of micromachining allowed fabrication of smaller probes disposed on the substrate, and a large number of probes can be arranged with narrow spacing. Further, the electrical characteristics of the probe card are improved since the probes are very short. Further, micromachining process using silicon as the base material hag been well established. Silicon, especially in single crystal form, has excellent elastic property which can be readily used for probe structure material. It is important that all the probes can accurately contact the pads of the device, and therefore, each of the probes should contact the pad by pressing with a predetermined value of pressure to ensure the accurate contact between the probe and the pad, and the sharpened end portions of probes should be placed at uniform height to maintain the preferred co-planarity. If the probe has elasticity and can be elastically deformed, the desired measurement can be accomplished even when the sharpened end portions of the probes are variously disposed or when the height of the pads varies, i.e., the semiconductor wafer, in which the device is located, is distorted. Therefore, the probe is required to have elasticity. Employing elastic material such as silicon for the probe material can facilitate fabrication of elastic probes.

Silicon probes can be formed as membrane type probe card. However, membrane type probe card has disadvantage of small elasticity. This property is caused by the fact that the sharpened end portion of the probe is connected to the substrate in all 360 degree directions. To create probe card for large area probing, it is usually required elastic deformation of more than tens of microns and spacing between the centers of the sharpened end portions less than one hundred microns in some places. Membrane type probe meets the spacing requirement but usually it is not possible to satisfy the elastic deformation criteria.

Cantilever style silicon probes can overcome the disadvantage of membrane type card, provided that there is some space where the cantilever can be extended. The spacing between the centers of the sharpened end portions can be less than 50 microns. The disadvantage of silicon probe is the brittleness of silicon. Hence, to ensure sufficient elastic deformation, the length of cantilever should be lengthened accordingly. Further, the previous design of silicon cantilever usually employed stacking of multiple layers by various deposition methods, which complicates the fabrication process and also reduces the mechanical stability.

In view of the aforementioned problems for micromachined probes, it is an objective of the present invention to provide a probe card with improved mechanical property and relative freedom of size and position using silicon cantilevers for the testing of the microelectronic devices.

SUMMARY OF THE INVENTION

An objective of the present invention is to provide a micro cantilever-type probe disposed on a probe card, having such appropriate elasticity and mechanical strength that the probe would recover its unforced shape after deformation during an inspection and maintain its original shape even after three hundred thousand uses.

For this purpose, the present invention provides a probe card comprising an electrically insulated substrate fixed on a circuit board; a plurality of elastic probes with a sharpened end fixed on said insulated substrate; and wiring formed on said probe, said insulated substrate and said circuit board. The inventive probe is manufactured by patterning a substrate using photolithography and etching a portion except a pattern-defined portion. The insulated substrate controls the probe so that a deformation of said probe may be stopped before said probe reaches a limit of elastic deformation. The probe is coated by metal layer(s)

Further, according to the present invention, the probe card comprises a substrate made of insulating material and probes are made of single crystal silicon. That is, the probe, which comprises a base, a cantilever, and a pointed end, is made up of a single material. There is provided space between the substrate and the probes to allow the body of the probes to elastically move.

BRIEF DESCRIPTION OF THE DRAWINGS

The foregoing and other objects, features and advantages of the present invention will be apparent from the following description of a preferred embodiment of the present invention, as illustrated in the accompanying drawings.

DETAILED DESCRIPTION OF THE INVENTION

Figure 1:
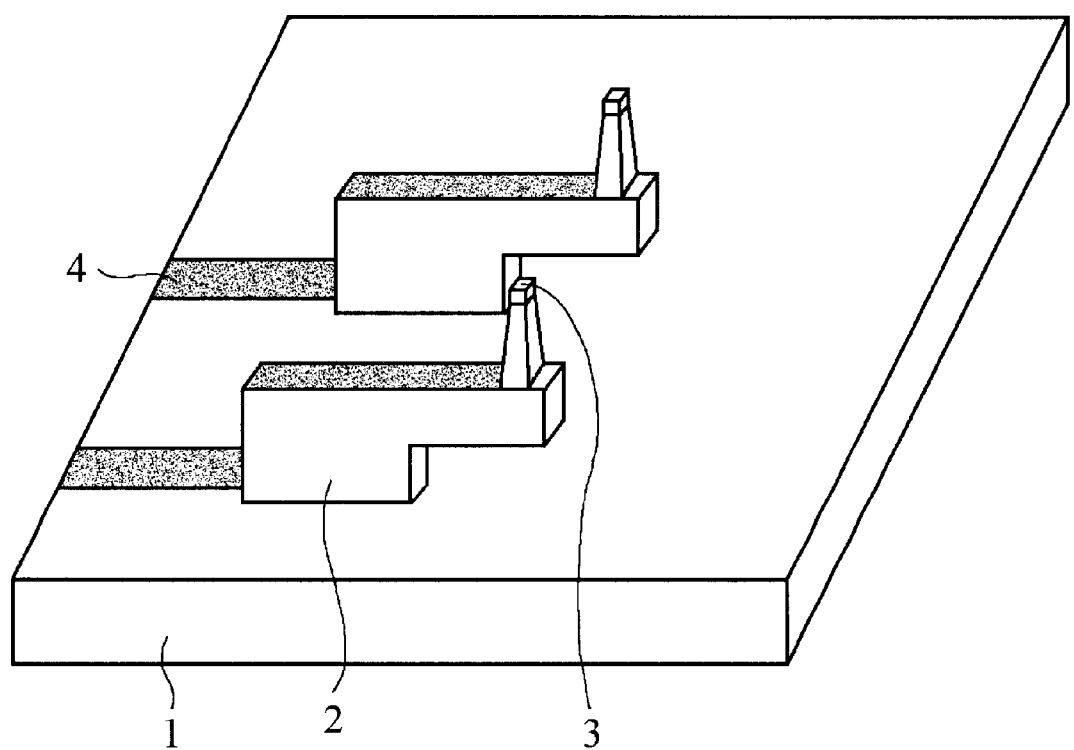
FIG. 1 is a perspective view of a probe card according to the present invention.
Figure 2A:
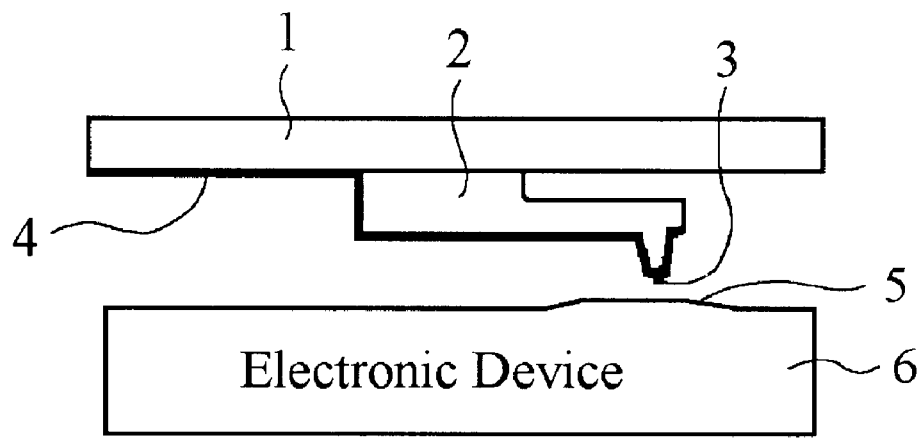
FIG. 2A is a side view of a probe card according to the present invention.
Figure 2B:
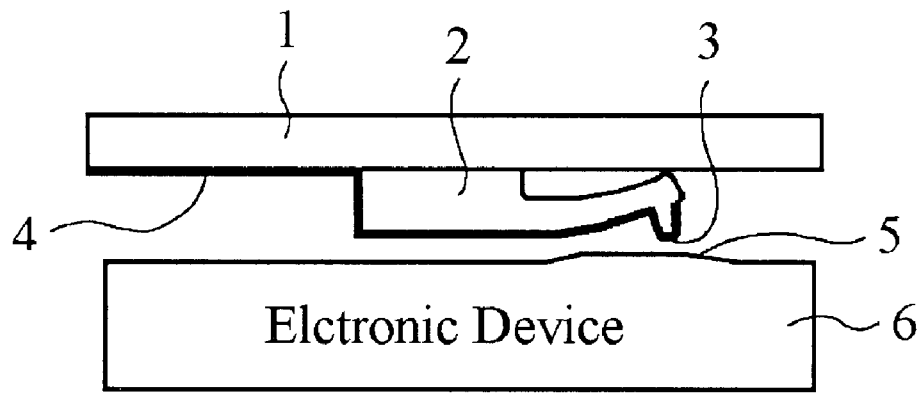
FIG. 2B is a side view of a probe card according to the present invention in the state of elastic deformation during its use.

FIG. 1 shows one embodiment a probe card according to the present invention. The probe card is mainly composed of a plurality of probes 2 that are bonded on an insulating substrate 1. The probes, made of single-crystal silicon, are reinforced with a coating of a high-strength metal, for example tungsten. Wiring 4 is formed on the substrate for electrical connection between the prober and an external testing/control circuitry usually disposed in the main body of a probe station. In FIG. 1, only two probes 2 with sharpened end portions 3 are shown for illustrative purposes. In reality the number of probes depends on the number of pads in a device to be inspected and could be as many as several thousands. FIG. 2A is a side view of the probe card of FIG. 1. An electronic device 6 with a plurality of pads 5 on its surface is also shown. As the device 6 is controllably raised with the vertical movement of a stage on which the device 6 is placed, the pointed tips of the probes contacts the pad 5 of the device 6 and the arms of the probes are elastically bent under pressure, as shown in FIG. 2B. When the probe station is separated from the device after inspection, the probe arms are restored to their original shape.

An exemplary process for fabricating the probes according to the present invention is described hereinafter.

First, a probe pattern is defined by using lithography on a single-crystal silicon substrate. When selected areas of the substrate in accordance with the probe pattern are removed in a sequence of repeated lithographic and etching processes, probes, each having a base, a cantilever and a sharpened end, are formed. The resultant probes are attached onto a substrate made of glass or ceramics by fusion or anodic bonding. An electrically conducting layer is deposited all over on thus-formed probes by sputtering, evaporation or chemical vapor deposition (CVD). Electrical circuitry needed on the probe card to carry signals to the sharpened ends may be formed by a series of photolithography and etching or a series of photolithography and lift-off process. Then a metal layer is electroplated or electrolessly plated over the point. The metal layer reinforces the probes and thus helps to prevent fracture of the cantilever when it is bent. The metal layer also increases wear resistance of the sharpened end portion during the lifetime of probe card. A material having a high mechanical strength such as tungsten may be deposited on the sharpened end 3 of the probe 2 (See FIG. 1). Alternatively, the sharpened end of the probe may be separately manufactured with tungsten and attached to an open end of the probe. Finally, the single-crystal silicon substrate that is now transformed into a probe block is bonded to a circuit board and electrical connection between the two is made.

This process for forming probes according to the present invention will be described more in detail.

Figure 3:
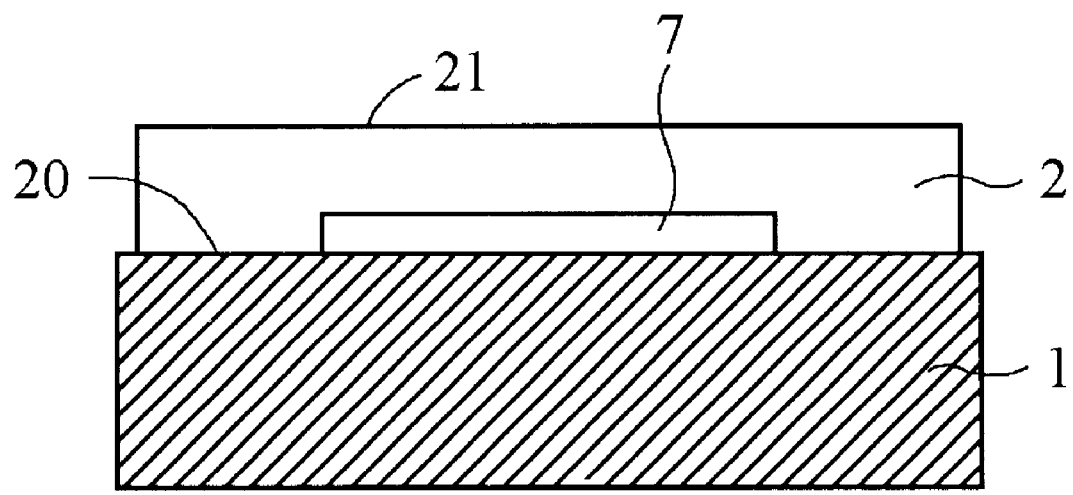
FIG. 3 shows a silicon wafer which is attached to the insulating substrate after first etching.

A silicon oxide and a silicon nitride film are deposited on both surfaces of a single crystal silicon wafer by thermal CVD, physical vapor deposition (PVD) or plasma enhanced CVD (PECVD). A pattern of probes is defined by photolithography. The silicon layer is vertically etched in depth of 5–500 micrometer by anisotropic wet etching using a KOH solution or by deep silicon dry etching that uses the loops of etching by $SF_6$ gas and aide wall passivation by $C_4F_8$ gas. The etched silicon layer is attached to a glass substrate by fusion bonding under the conditions of 1–5 atmosphere and 300–600 degrees Centigrade. Alternatively, the silicon and glass substrate can be anodic-bonded under the conditions of 200–500 degrees Centigrade, and application of electricity of 100–2000 V and 1–100 mA. The shape of bonded layer is shown in FIG. 3 and the etched portion 7 is left as vacant space. After bonding, if the thickness of silicon is above the desired value, the side 21 opposite to the bonded surface 20 of silicon layer is polished to adjust the thickness of silicon. The thickness of silicon layer is determined according to the size of the probe to be manufactured.

After polishing is performed, silicon oxide and/or silicon nitride film is deposited on the side of the silicon layer by using thermal CVD, physical vapor deposition (PVD), or plasma enhanced CVD (PECVD). The pattern of the area of the sharpened end portion is defined by photolithography and etched. The etched silicon oxide film or silicon nitride film is used as a mask for etching silicon. The silicon layer is vertically etched in depth of 5–500 micrometer by using anisotropic wet etching using KOH solution to manufacture the sharpened end portion 3 of the probe. Alternatively, deep silicon dry etch process can be utilized for the etching of the silicon. After forming the pointed portion, silicon oxide film or a silicon nitride film is deposited by using thermal CVD, physical vapor deposition (PVD), or plasma enhanced CVD (PECVD). The pattern of the area of the body portion of the probe is defined by the photolithography and etched to manufacture the body portion 2 of the probe. The etching process can be proceeded by vertically etching the silicon layer in depth of 5–500 micrometer by using anisotropic wet etching using KOH solution. Alternatively, deep silicon dry etch process can be utilized for the etching of the silicon. According to the above processes, the basic shape of the probe is formed. Further, the process of introducing boron or phosphorus into the silicon probe by using ion implantation or thermal diffusion can be added to enhance the electrical conductivity of the probe. And then, the wiring is formed from the sharpened end portion 3 to the substrate 1 by using the deposition process such as sputtering, evaporation or CVD together with the photolithography. The wiring can be formed on the side of the substrate on which the probe is installed, on the opposite side of the substrate on which the probe is installed, or in the substrate as imbedded layers. Copper, platinum, palladium, gold, tungsten, nickel, chrome, nickel chrome alloy or other metal layer of 1–20 micron thick is deposited on the formed probe using electro- or electroless-plating. The manufactured probe fixed on the substrate is attached to the circuit board.

Figure 4A:
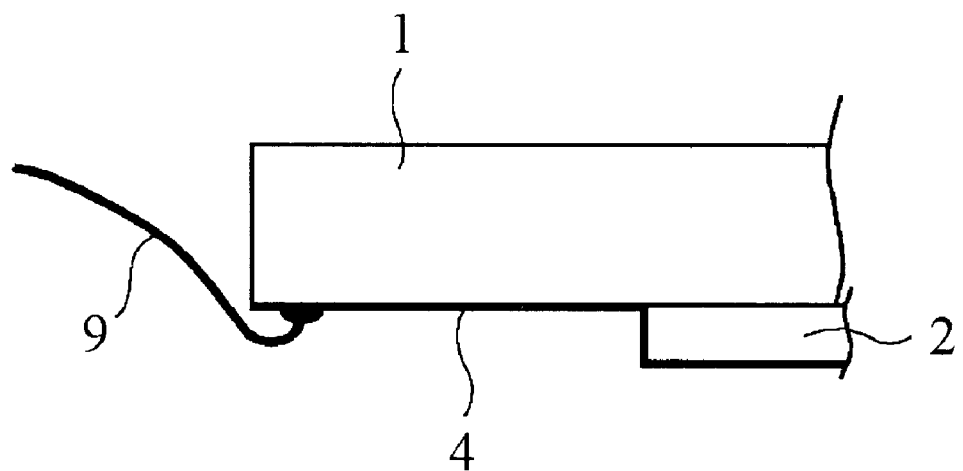
FIG. 4A shows an example of connection of the wiring portion to the circuit board.
Figure 4B:
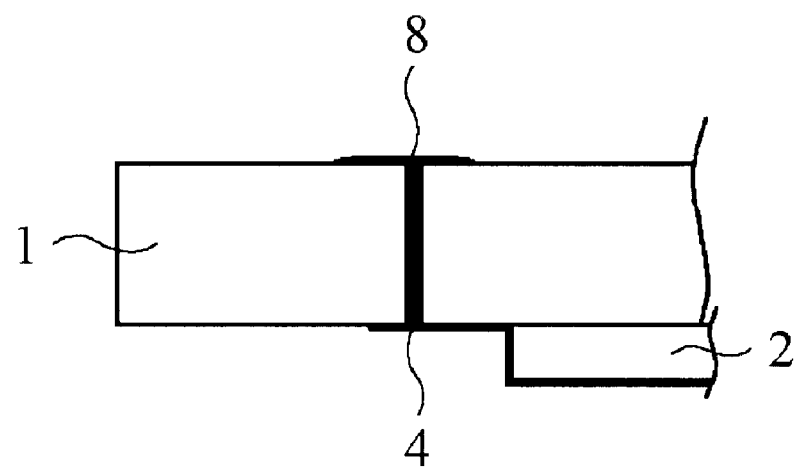
FIG. 4B shows another example of connection of the wiring portion to the circuit board.
Figure 5A:
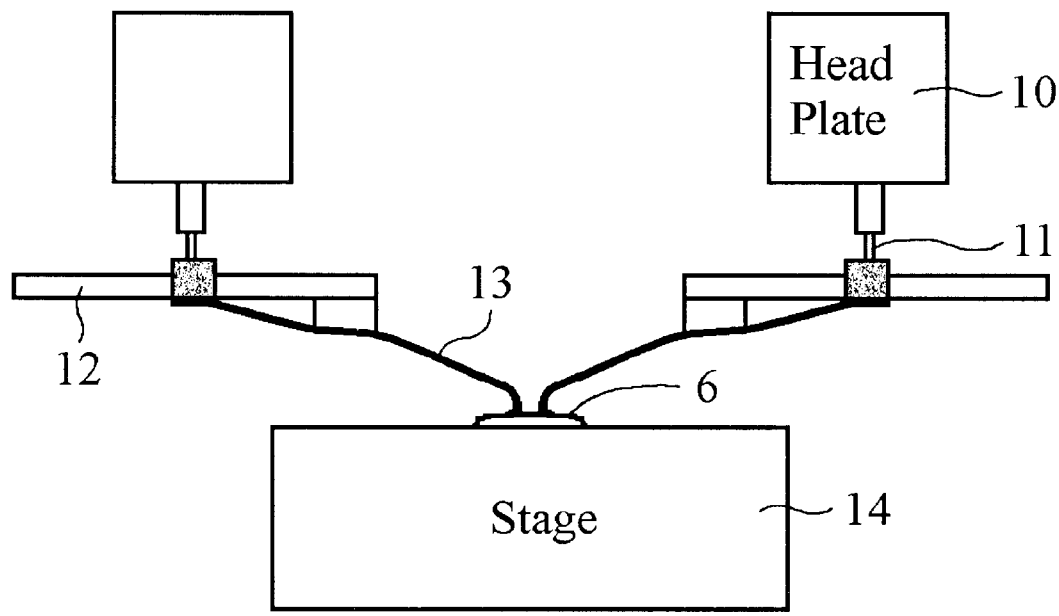
FIG. 5A is a schematic drawing of a conventional probe station.
Figure 5B:
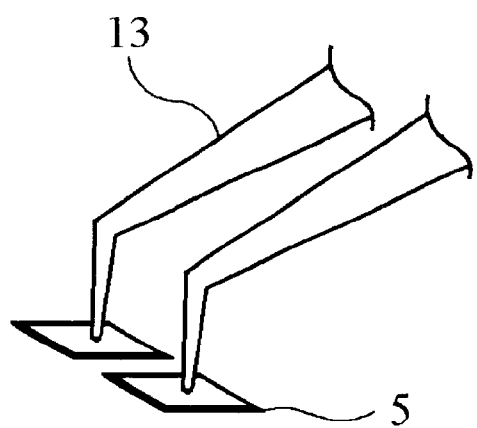
FIG. 5B is an enlarged partial perspective of the probe portion in the conventional probe station.

Various methods exist for connecting the circuit board and the wiring portion formed on the substrate, and FIG. 4A and FIG. 4B show two examples. FIG. 4A shows a method of forming a hole through the substrate and filling the conductive material therein, and FIG. 4B shows a method of forming the wiring on the probe and the substrate and accomplishing a wire bonding to the wiring.

Another process for forming probes according to the present invention will be described in detail in reference to FIGS. 6–8.

Figure 6A:
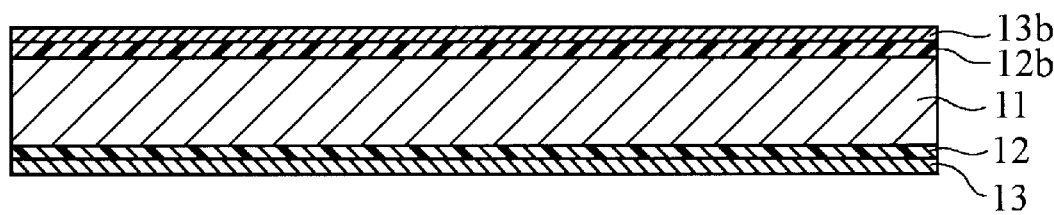
FIGS. 6A through 6F illustrate a silicon wafer manufacturing process before substrate bonding.
Figure 6B:
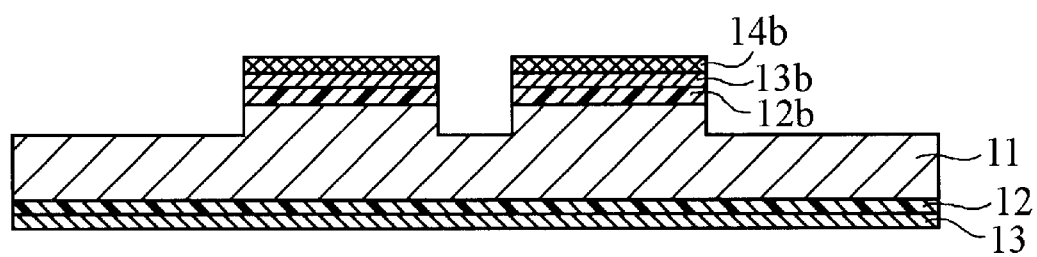
Figure 6C:
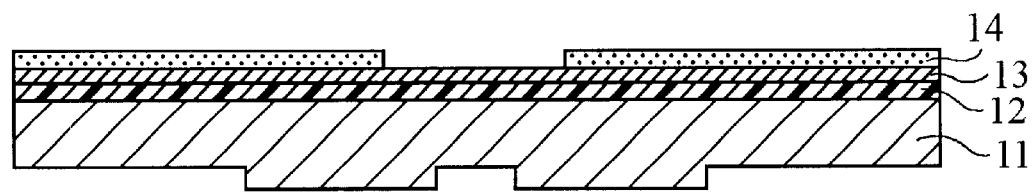
Figure 6D:
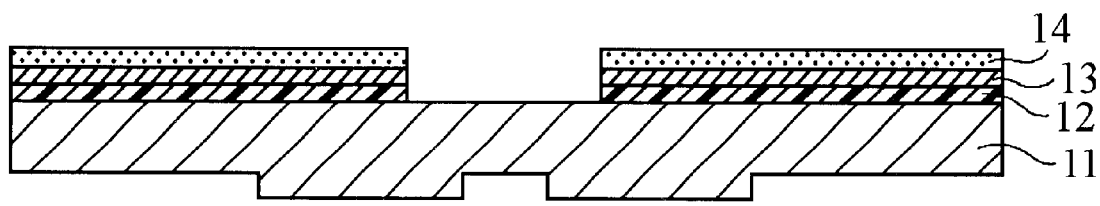
Figure 6E:
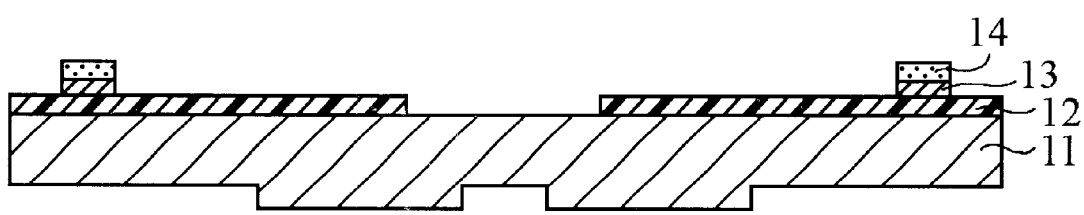
Figure 6F:
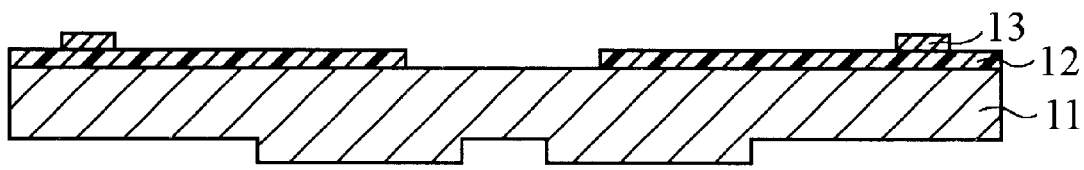

First, silicon oxide films 12, 12b and silicon nitride films 13, 13b are formed on either side of a single crystal silicon wafer 11, an shown in FIG. 6A. As the single crystal silicon wafer 11, a (110)-oriented single crystal silicon or a (111)-oriented single crystal silicon can be used. Specifically, 50~1500 nm thick silicon oxide is grown by wet or dry oxidation. Oxidation process may be used with $O_2$, $N_2$ and/or $H_2$ gases at temperatures above 900° C. On top of the silicon oxide layers 50~300 nm thick, silicon nitride is deposited by LPCVD (low pressure chemical vapor deposition), which uses DCS ($SiH_2Cl_2$) and $NH_3$ gases in a 600~850° C. temperature range. Next, a predetermined probe pattern is defined on one side of the silicon substrate, using photolithography, as shown in FIG. 6B. With a photoresist 14b as a mask, silicon nitride 13b and silicon oxide layer 12b are etched in sequence in accordance with the probe pattern. Here, the silicon nitride layer 13b may be dry etched by using $CP_4$, $CHF_3$, $O_2$, He gases in the RIE or ICP systems while the silicon oxide layer 12b may be etched either in BOE (buffered oxide etchant) wet etchant or dry etch systems like as silicon nitride etching. After the photoresist 14b is stripped, the remaining oxide and nitride pattern is used as a mask for etching the silicon wafer 11. The silicon wafer is vertically etched in depth of 20–300 $\mu$m by using anisotropic wet etchant like as KOH, TMAH, EDP solution or by using deep silicon dry etching process that uses the loops of etching by $SF_6$ gas and side wall passivating by $C_4F_8$ gas. Vertical wet etching can be done on single crystal silicon wafers which have (110)-orientation. If a (111)-oriented single crystal silicon is used, a deep silicon dry etching can be used. Next, the silicon wafer is turned over as shown in FIG. 6C after the silicon nitride 13b and silicon oxide 12 are removed by dry etch and BOE. The silicon nitride 13 and silicon oxide 12, now on top, undergo photolithographic and etching processes, as shown in FIGS. 6C–6D. After the photoresist 14 is stripped, the silicon nitride layer 13 is patterned again and etched leaving except for selected areas where sharpened ends of the probes would be formed, as shown in FIG. 6E. When the photoresist 14 is removed, intermediate structure of probes as shown in FIG. 6F is obtained.

Figure 7A:
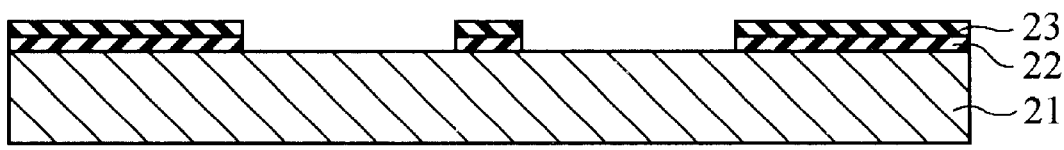
FIGS. 7A through 7E illustrate the preparation of an electrically insulated substrate on which the probes are bonded and the boding process.

Now, the preparation of a glass or ceramic substrate on which the probes are bonded and the boding process itself will be described. Metal 22 such as Al, Ti, Cu and Cr is deposited by sputtering on a glass substrate 21 up to a thickness of 2 $\mu$m. The metal layer 22 is etched using a photoresist of predetermined pattern 23 in order to expose selected areas of the glass substrate 21, as shown in FIG. 7A.

Figure 7B:
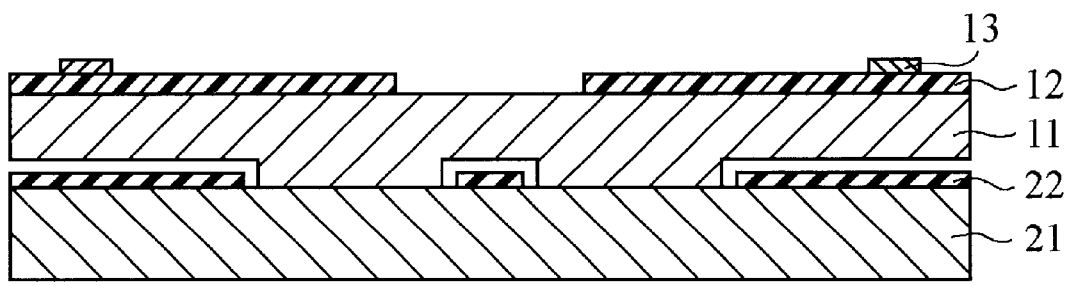

After photoresist 23 is stripped, the silicon wafer 11 prepared in the previous steps (See FIG. 6F) are bonded onto the glass substrate 21 at those exposed areas by fusion bonding as shown FIG. 7B. The boning is performed at 1–5 atmosphere and 300–600 ° C. Alternatively, the silicon wafer 11 and glass substrate 21 can be anodic-bonded at 200–500° C. with application of voltage of 100–2000 V and 1–100 mA.

Figure 7C:
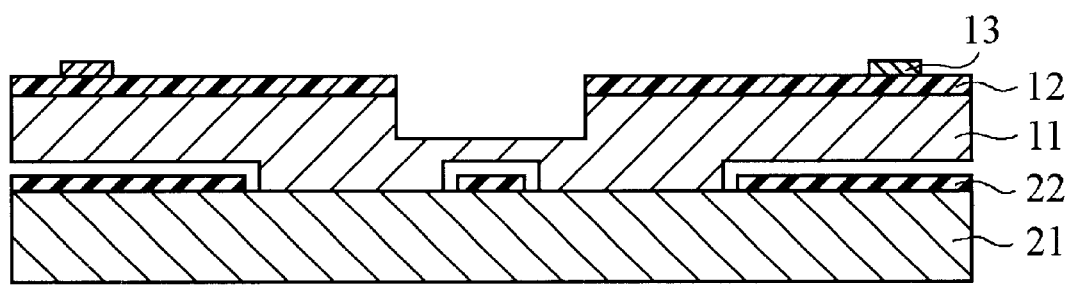
Figure 7D:
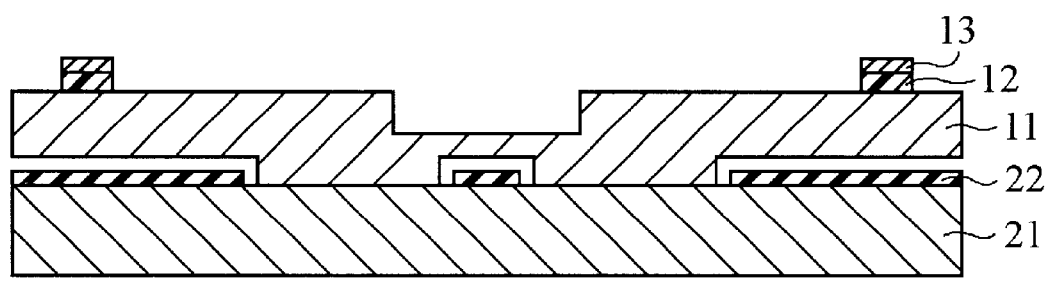
Figure 7E:
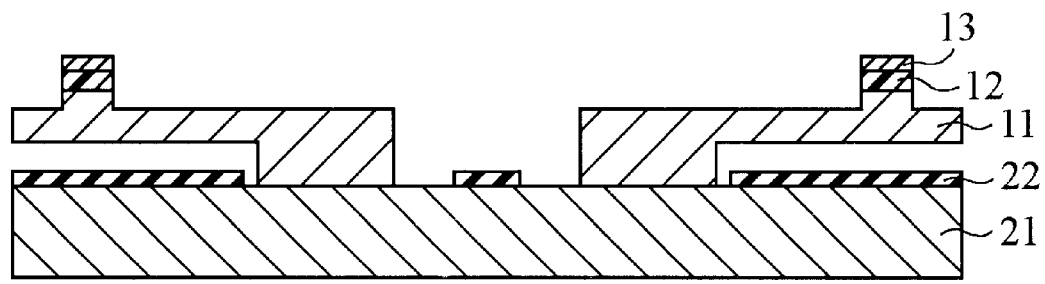

The silicon wafer 11, now disposed on the glass substrate 21, is further etched, as shown in FIG. 7C, using the silicone oxide 12 as a mask. The etching depth depends on a predetermined cantilever design parameters such the base thickness, cantilever length, silicon wafer thickness, and height of the sharpened ends. Typically the silicon wafer 11 is etched up to 100~300 $\mu$m by KOH, TMAH, EPD wet etchant or vertical deep silicon etcher. Then, as shown in FIG. 7D, the silicon oxide 12 is removed except for where the sharpened ends would be formed. The top surface of the silicon wafer 11 is further etched to a certain depth of 50~200 $\mu$m for defining the sharpened ends as shown in FIG. 7E.

After the desired shape of probes are formed integrally of single crystal silicon as described above, the probes are plated with a metal layer for adding mechanical strength particularly to the cantilever portion of the probes and for providing electrical conduit between the tips of probes to circuitry in the circuit board. First, boron or phosphorus may be introduced into thus formed silicon probes before metal plating, by using ion implantation or thermal diffusion in order to enhance the electrical conductivity. An exemplary process for covering the probes with a metal layer will be explained in reference to FIGS. 8A–E in the following.

Figure 8A:
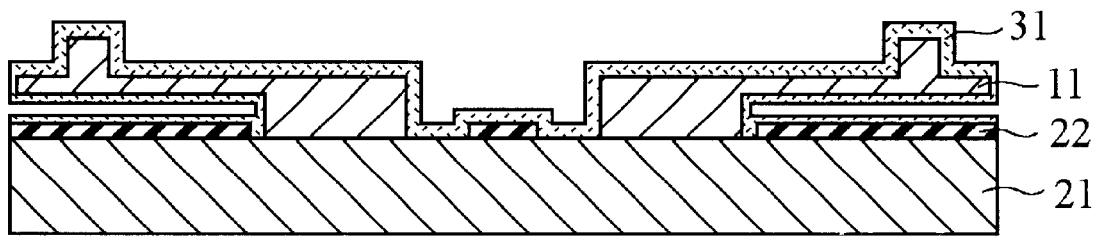
FIGS. 8A through 8E illustrate the process of covering the probes with a metal layer.
Figure 8B:
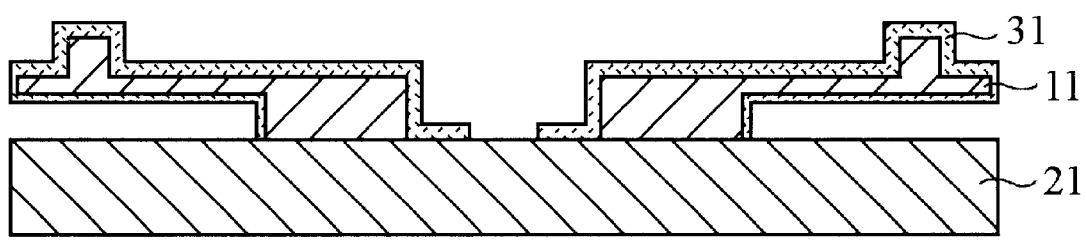
Figure 8C:
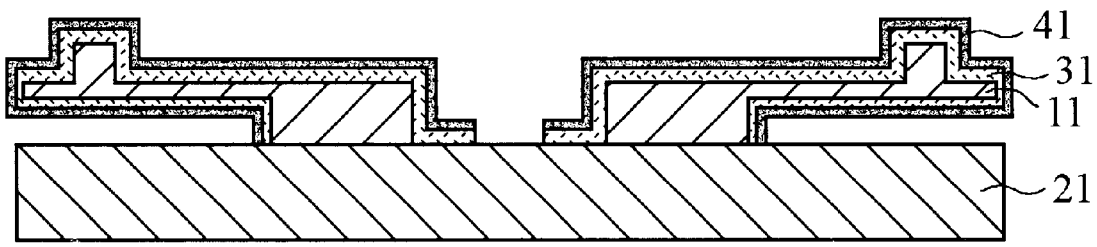

First, a thin layer of Ti and/or Cr is coated by sputtering on the overall surface of the probes 11 and the glass substrate 21, as shown in FIG. 8A, as an adhesion and seed layer for a subsequent plating of a thicker conductive metal layer. The layer 31 of Ti and/or Cr metal is 10–200 nm. The wiring pattern is formed by the lift-off process on the metal layer 22 that was formed on the glass substrate 21, as shown in FIG. 8B. If photolithography is used to form a wiring pattern on the glass substrate, photoresist must be spray coated because the spray coating allows a conformal coating of a photoresist over a 3-dimensional structure. If spray coating is used, sputtering and photolithography can form the metal wiring 31, and liftoff layer is not necessary. Next, a copper, platinum, palladium, gold, tungsten, nickel, chrome, nickel chrome alloy or other metal layer 41 of 1–20 micron thickness is coated on the probes, using electro- or electroless-plating as shown in FIG. 8C. This metal layer 41 reinforces the probes so that the cantilever portion would not suffer fracture after repeated cases of elastic bending and improves electrical conductivity, contact resistance, usability, and wear resistance of the sharpened ends. Metal wiring can be formed also on the opposite side of the substrate on which the probe is installed, or in the substrate as imbedded layers.

Figure 8D:
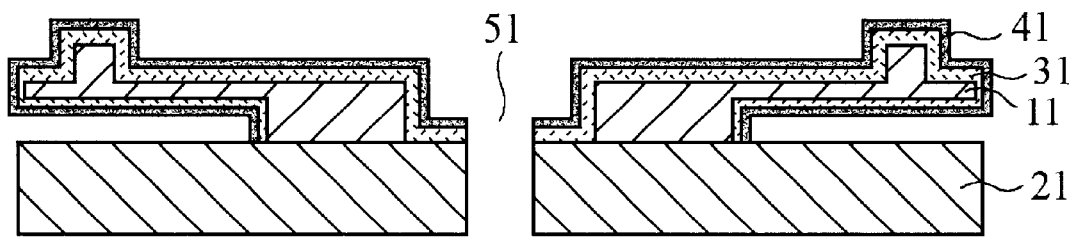

In the case that two rows of probes are designed with the sharpened ends face away from each other, the glass substrate 21 is cut or slotted to provide paths 51 through which electrical wire is passed connecting the probes to circuitry in a circuit board under the glass substrate, as shown in FIG. 8D. The through holes 51 can be formed by laser micromachining, wire cutting, and/or dicing. Typically UV laser, excimer laser, dicing saw, ultrasonic cutter and/or EDM (electrochemical discharge machining) can be used to cut the glass substrate.

Figure 8E:
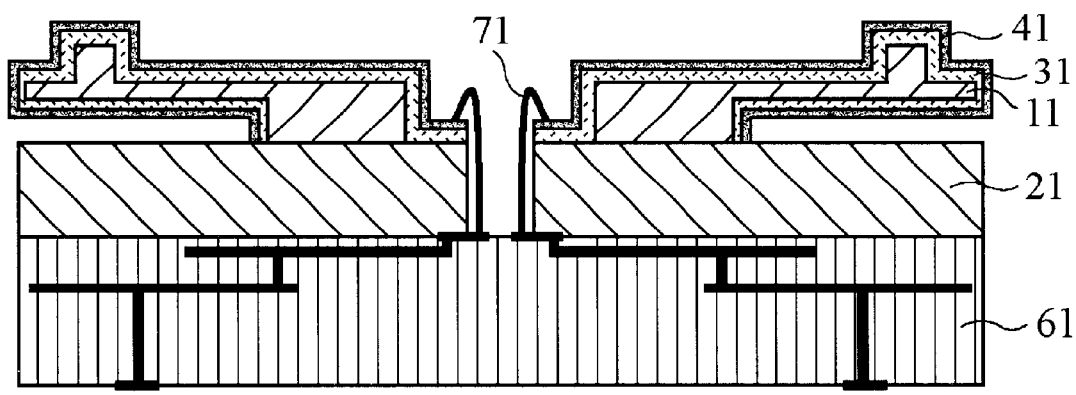

Now completed probing blocks are firmly attached to a circuit board 61, as shown in FIG. 8E using various epoxies as adhesive. Various methods exist for electrically connecting the circuit board and the wiring formed on the glass substrate. FIG. 4A and FIG. 4B show two examples. FIG. 4B shows a method of forming a hole through a substrate and filling conductive material in the hole. FIG. 4A shows forming a wire bonding pad on the probe block and bonding the pad to the circuit board. In FIG. 8E, wire 71 is shown to connect the wire bonding pad of the glass substrate and circuit board. After all these processes, the inventive micro probe as shown in FIG. 1 is obtained.

According to the present invention, very uniformly and precisely placed probes are installed on the plane substrate, hence allowing accurate measurement of the electrical characteristics of a plurality of semiconductor devices simultaneously.

Further, according to the present invention, the probes are small and the size of each of the probes can be designed according to its purpose, therefore the probe card having desired electrical characteristics can be manufactured.

Another effect of the present invention is that the lifetime of the probe card is long because the probe has excellent elastic properties due to the base single crystal silicon, hence plastic deformation hardly occurs.

Another advantage of present invention is the thickness of the plated metal layer allows cleaning of the probe by grinding the sharpened end portion on abrasive paper, which is customary practice of conventional probe card cleaning. And also, micro cantilever toughness, conductivity, and contact resistance can be improved.

Although the present invention is described with respect to particular embodiments thereof, it will be apparent to those skilled in the art that various applications and modifications can be readily made without departing from the scope of the above-described features of the present invention. Therefore, the present invention should not be interpreted to be limited to the embodiments described above and is only restricted to the appended claims.

What is claimed is:

1. A probe card for measuring electrical characteristics of a device by electrically coupling probes to pads of said device, said probe card comprising:
    an electrically insulated substrate fixed on a circuit board;
    a plurality of probes fixed on said electrically insulated substrate, each having a base, an elastic cantilever, and a pointed end, such that said insulated substrate restricts an elastic micro movement of said elastic micro cantilever;
    electrical wiring pattern formed on said probes and said insulated substrate; and
    an electrically conducting layer plated on said electrical wiring pattern,
    wherein said base, said elastic micro cantilever, and said pointed end of each of said probes are integrally made of single crystal silicon and manufactured by a pattern-defining photolithography that etches away the material except a pattern-defined portion.

2. A probe card according to claim 1, wherein said single crystal silicon is (110)-oriented single crystal silicon.

3. A probe card according to claim 2, wherein said probes are vertically etched using KOH, TMAH, EDP wet etchant, which has anisotropic etch characteristics.

4. A probe card according to claim 1 or 2, wherein said electrically insulating substrate is made of glass or ceramic.

5. A probe card according to claim 1, wherein said probes are vertically etched by deep silicon dry etch on a (111)-oriented single crystal silicon.

6. A probe card according to claim 1, wherein impurities are introduced into said probes by ion implantation or thermal diffusion to enhance an electrical conductivity of said probes.

7. A probe card according to claim 1, wherein said probes are formed by a series of pattern-defining photolithographic and etching processes that etch away unwanted portions from the single crystal silicon.

8. A probe card according to claim 1, wherein said electrically conducting layer is plated using electroplating or electroless plating of one or more of metal layer(s) such as copper, platinum, palladium, gold, tungsten, nickel, chrome, nickel chrome alloy.

9. A probe card according to claim 1, wherein said probes are fixed on said electrically insulating substrate by using fusion bonding or anodic bonding.

10. A probe card according to claim 1, wherein said electrical wiring pattern is created by sputtering, chemical vapor deposition, or evaporation of a electrically conducting material and etching or lifting-off.

11. A probe card according to claim 10, wherein, when said lifting-off is used, a sacrificial layer is deposited on the electrically-insulating substrate before said plurality of probes are fixed on said insulated substrate.

12. A probe card according to claim 10, wherein said sacrificial layer for said liftoff is made of Al, Ti, Cu, Cr or oxides like as $Al_2O_3$, $SiO_2$, $TiO_2$.

13. A probe card according to claim 10, wherein said photolithography is done by spray coating on a surface of said probe for conformal step coverage of photo resist.

14. A probe card according to claim 1, wherein said probes are structurally and electrically separated from one another.

15. A probe card according to claim 1, wherein said pointed end of each of said probes is plated with tungsten or tungsten silicide.

16. A probe card according to claim 1, wherein said electrical wiring is connected to the said circuit board by wire bonding method.

17. A probe card according to claim 1, wherein said electrical wiring is connected to the said circuit board by forming one or plurality of hole(s) in the said insulated substrate and filling the hole with electrically conducting material.

18. A probe card according to claim 1, wherein said insulated substrate is cut into desired shape by UV laser, excimer laser, dicing saw, ultrasonic cutter and/or EDM (electrochemical discharge machining).

19. A method for manufacturing probe needles, said method comprising:

provida monolithic single crystal silicon;

forming probe needles by defining a pattern on said monolithic single crystal silicon by photolithography and etching away undefined portions of said monolithic single crystal silicon;

forming a thin metal layer by sputtering a first metal on the surface of said probe needles; and forming a thicker metal layer by plating a second metal on said thin metal layer, wherein said probe needles each comprises a base, an elastic cantilever, and a pointed end.

20. A method according to claim 19, said method further comprising:

forming a sacrificial layer by sputtering third metal on a substrate;

etching said sacrificial layer using predetermined photoresist pattern to expose selected areas of said substrate;

forming said thin metal layer by sputtering said first metal on said sacrificial layer and on the surface of said probe needle body; and forming a wiring pattern by lift-off process on said thin metal layer.

* * * * *